(12) United States Patent
Aybay et al.

(10) Patent No.: US 7,492,591 B1
(45) Date of Patent: Feb. 17, 2009

(54) REVERSIBLE AIRFLOW FAN TRAY FOR AN ELECTRONIC DEVICE

(75) Inventors: Gunes Aybay, Los Altos, CA (US); Tri Luong Nguyen, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 227 days.

(21) Appl. No.: 11/621,825

(22) Filed: Jan. 10, 2007

(51) Int. Cl.
*H05K 7/20* (2006.01)
*H05K 5/00* (2006.01)
*A47B 77/08* (2006.01)
*F04B 17/00* (2006.01)

(52) U.S. Cl. .......... 361/695; 361/694; 454/184; 312/236; 415/193; 415/219.1; 415/206; 417/360; 417/423.5

(58) Field of Classification Search .......... 361/694, 361/695; 454/184; 312/236; 415/206, 193, 415/219.1; 417/360, 423.5
See application file for complete search history.

(56) References Cited

U.S. PATENT DOCUMENTS

| | | | |
|---|---|---|---|
| 5,927,389 A | 7/1999 | Gonsalves et al. | |
| 6,071,082 A * | 6/2000 | Lecinski et al. | ............ 417/53 |
| 6,195,493 B1 | 2/2001 | Bridges | |
| 6,388,880 B1 | 5/2002 | El-Ghobashy et al. | |
| 6,457,949 B1 | 10/2002 | Bendikas et al. | |
| 6,499,609 B2 | 12/2002 | Patriche et al. | |
| 6,549,406 B1 | 4/2003 | Olesiewicz et al. | |
| 6,579,062 B2 | 6/2003 | Lu et al. | |
| 6,604,916 B2 | 8/2003 | Lu et al. | |
| 6,708,372 B2 | 3/2004 | Stewart | |
| 6,714,411 B2 | 3/2004 | Thompson et al. | |
| 6,717,809 B2 | 4/2004 | Chen et al. | |
| 6,749,398 B2 | 6/2004 | Lu et al. | |
| 6,839,233 B2 * | 1/2005 | Cravens et al. | ............ 361/695 |
| 6,921,247 B2 | 7/2005 | Stewart et al. | |
| 6,985,358 B2 | 1/2006 | Thompson et al. | |
| 7,054,155 B1 | 5/2006 | Mease et al. | |
| 2002/0094282 A1 | 7/2002 | Bendikas et al. | |
| 2003/0184968 A1 | 10/2003 | Steinman | |
| 2004/0264145 A1 * | 12/2004 | Miller et al. | ............ 361/725 |
| 2005/0174734 A1 | 8/2005 | Chen et al. | |
| 2005/0254210 A1 | 11/2005 | Grady et al. | |
| 2006/0012929 A1 | 1/2006 | Chen et al. | |
| 2006/0203446 A1 | 9/2006 | Radhakrishnan et al. | |
| 2006/0237208 A1 | 10/2006 | Mangold | |
| 2006/0256522 A1 | 11/2006 | Wei et al. | |

* cited by examiner

*Primary Examiner*—Jayprakash N Gandhi
*Assistant Examiner*—Zachary M Pape
(74) *Attorney, Agent, or Firm*—Shumaker & Sieffert, P.A.

(57) ABSTRACT

Reversible airflow in cooling systems of electronic devices is described. For example, an electronic device may include a reversible fan tray. The fan tray may include symmetric mounting features that allow the fan tray to be mounted in the electronic device in more than one orientation at the same location within the electronic device such that one or more fans in the fan tray either direct air into the electronic device or to pull air from electronic device. The fan tray may further include a symmetric arrangement of connectors that coincide with the symmetric arrangement of mounting features to allow the fan tray to be connected to a power source of the electronic device any of the more than one orientations. An arrangement of electronic devices including reversible fan trays may be configured so that inlet and outlet airflows are separated to increase cooling efficiency of the electronic devices.

20 Claims, 6 Drawing Sheets

REVERSIBLE AIRFLOW FAN TRAY FOR AN ELECTRONIC DEVICE

TECHNICAL FIELD

The invention relates to controlling airflow through an electronic device.

BACKGROUND

Electronic devices that consume a large amount of power often create heat that needs to be removed during operation. For this reason, many electronic devices include cooling systems, such as system cooling fans. For example most computers and other computing devices include cooling fans.

In rack mount electronic devices, front to back airflow is one common cooling configuration. However, for devices that require large number of connections in the front panel, e.g., switching equipment, side-to-side airflow cooling systems provide more efficient space utilization than front to back airflow cooling systems. Oftentimes, such electronic devices are arranged adjacent one another in high density rack configurations. That is, in high-density rack environments (e.g. data centers, wiring closets), the racks are often mounted side-by-side with minimal spacing. This can result in heated air exiting one device being directed into an airflow inlet of the cooling system of an adjacent electronic device in the next rack. The heated air from the electronic device in the previous rack reduces the effectiveness of the cooling system of the adjacent electronic device compared to air having an ambient temperature.

SUMMARY

In general, techniques are described for providing reversible airflow for electronic devices with cooling systems utilizing side-to-side airflow cooling systems. For example, an electronic device may include a reversible fan tray. The fan tray may include symmetric mounting features that allow the fan tray to be mounted in the electronic device in more than one orientation at the same location within the electronic device such that one or more fans in the fan tray either direct air into the electronic device or to pull air from electronic device. The fan tray may further include a symmetric arrangement of connectors that coincide with the symmetric arrangement of mounting features to allow the fan tray to be connected to a power source of the electronic device in any of the more than one orientations. An arrangement of electronic devices including reversible fan trays, such as an arrangement of electronic devices within a high-density rack environment, may be configured so that inlet and outlet airflows are separated to increase cooling efficiency of the electronic devices.

In one embodiment, an arrangement of electronic devices comprising at least two electronic devices. Each electronic device in the arrangement includes a fan tray slot, and a reversible fan tray mounted in the fan tray slot providing either an airflow inlet or an airflow outlet. The reversible fan tray includes a frame sized to fit within the frame tray slot, at least two fans and a symmetric arrangement of mounting features fixed relative to the frame. The symmetric arrangement of mounting features allows the fan tray to be mounted in the electronic device in more than one orientation at the same location within the electronic device such that the at least two fans can be oriented to either direct air into the electronic device or to pull air from electronic device. The reversible fan tray further includes a symmetric arrangement of connectors fixed relative to the frame that coincide with the symmetric arrangement of mounting features. The connectors provide an electrical connection path between the electronic device and the at least two fans in each of the more than one orientation. An orientation of the reversible fan tray in the fan tray slot is reversible. Reversing the orientation of the reversible fan tray in the fan tray slot reverses a direction of the airflow to provide either the airflow inlet or the airflow outlet at the fan tray slot. The orientation of the reversible fan tray in each electronic device is selected such that if the reversible fan tray is adjacent to an airflow inlet in an adjacent electronic device, the reversible fan tray provides the airflow inlet and if the reversible fan tray is adjacent to an airflow outlet in the adjacent electronic device, the reversible fan tray provides the airflow outlet.

In another embodiment, an electronic device comprises a fan tray slot, and a reversible fan tray mounted in the fan tray slot providing either an airflow inlet or an airflow outlet. The reversible fan tray includes a frame sized to fit within the frame tray slot, at least two fans and a symmetric arrangement of mounting features fixed relative to the frame. The symmetric arrangement of mounting features allows the fan tray to be mounted in the electronic device in more than one orientation at the same location within the electronic device such that the at least two fans can be oriented to either direct air into the electronic device or to pull air from electronic device. The reversible fan tray further includes a symmetric arrangement of connectors fixed relative to the frame that coincide with the symmetric arrangement of mounting features. The connectors provide an electrical connection path between the electronic device and the at least two fans in each of the more than one orientation. Reversing the orientation of the fan tray in the fan tray slot reverses a direction of the airflow through the electronic device.

In an embodiment, a fan tray comprises at least two fans, a frame sized to fit within an electronic device, a symmetric arrangement of mounting features fixed relative to the frame, and a symmetric arrangement of connectors fixed relative to the frame that coincide with the symmetric arrangement of mounting features. The symmetric arrangement of mounting features allows the fan tray to be mounted in the electronic device in more than one orientation at the same location within the electronic device such that the at least two fans can be oriented to either direct air into the electronic device or to pull air from electronic device. The connectors provide an electrical connection path between the electronic device and the at least two fans in each of the more than one orientation.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
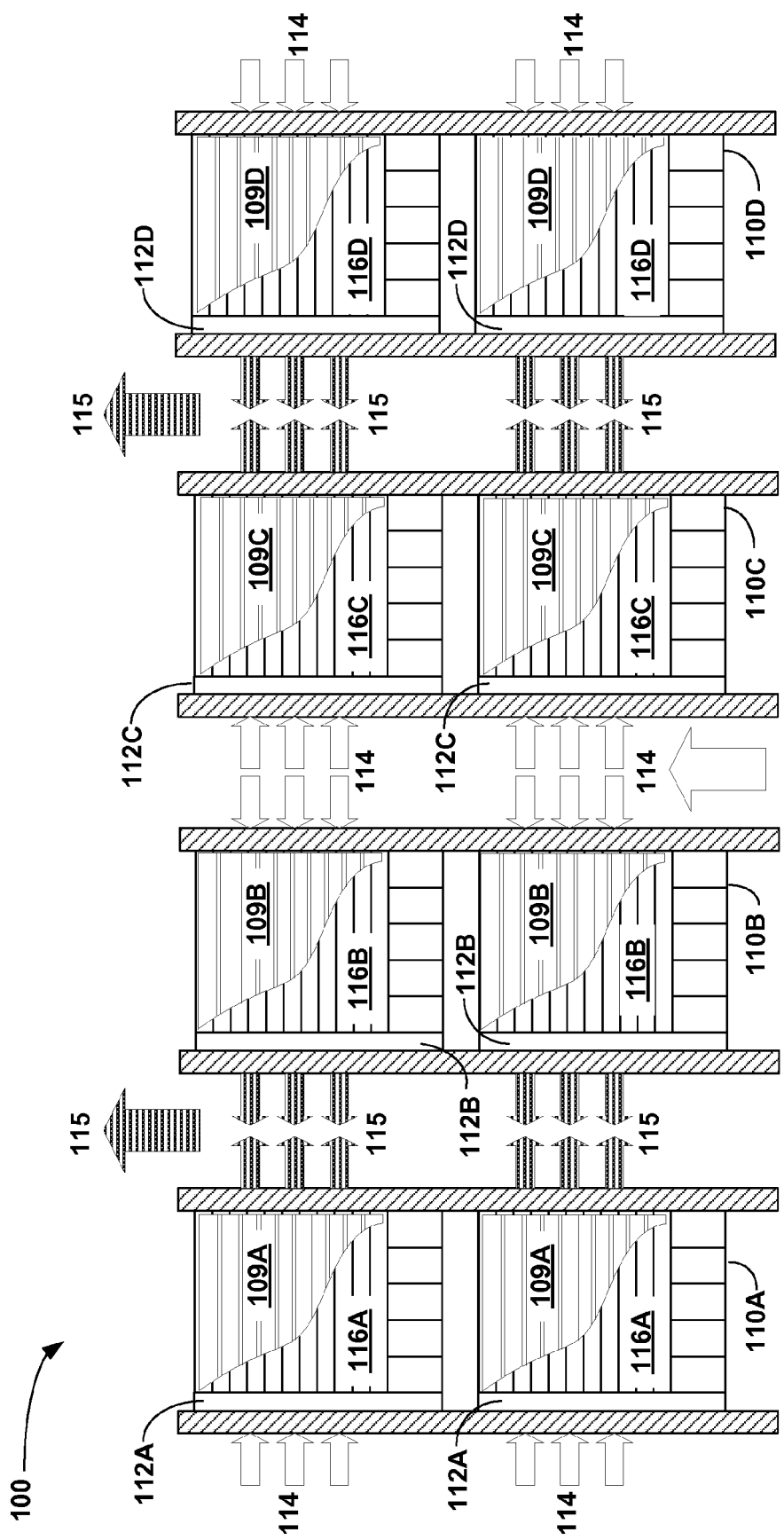
FIG. 1 is an illustration showing inlet and outlet airflow paths through a closely-packed arrangement of electronic devices.

FIG. 1 illustrates an arrangement 100 of electronic devices 110A-110D (electronic devices 110) with side-to-side cooling systems that include reversible fan trays 112A-112D (fan trays 112). Reversible fan trays 112 contribute to airflows over components 116A-116D (components 116) in electronic devices 110. Components 116 include front panels 109A-109D (panels 109). As shown in FIG. 1, the front of electronic devices 110 including panels 109 faces outwardly from the page.

In this example, each electronic device 110 includes two reversible fan trays 112: one upper fan tray and one lower fan tray. The orientation of each reversible fan tray 112 is selected such that if a reversible fan tray 112 is adjacent to an airflow inlet in an adjacent electronic device, the reversible fan tray 112 is oriented to provide an airflow inlet at the reversible fan tray 112. Comparatively, if the reversible fan tray 112 is adjacent to an airflow outlet, the reversible fan tray 112 is oriented to provide an airflow outlet at the reversible fan tray 112.

For example, assume fan trays 112A are oriented as shown in electronic device 110A. Fan trays 112A operate in parallel to provide airflow inlets that direct cool air 114 over components 116A. Hot air 115 exits electronic device 110A via airflow outlets on the opposite side of electronic device 110A. Because fan trays 112B in electronic device 110B are adjacent to the airflow outlets of electronic device 110A, fan trays 112B are oriented to provide airflow outlets for electronic device 110B. In this orientation, fan trays 112B pull air from electronic device 110B in order to cool components 1116B. Thus, the orientation of fan trays 112B in electronic device 110B is reversed relative to the orientation of fan trays 112A in electronic device 110A.

The orientations of fan trays 112C and 112D in electronic devices 110C and 110D respectively are configured in a similar manner. Because fan trays 112C in electronic device 110C are adjacent to the airflow inlets of electronic device 110B, fan trays 112C are oriented to provide airflow inlets for electronic device 110C. Similarly, because fan trays 112D in electronic device 110D are adjacent to the airflow outlets of electronic device 110C, fan trays 112D are oriented to provide airflow outlets for electronic device 110D.

The selected orientation of fan tray 112 prevents any hot air 115 from being directed into an airflow inlet. This increases the efficiency of the cooling systems of electronic devices 110, while allowing electronic devices 110 to be closely spaced to limit the total space necessary for the arrangement 100 of electronic devices 110.

Fan trays 112 include features to facilitate the multiple orientations within electronic devices 110. For example, fan trays 112 may include a symmetric arrangement of mounting features and/or a symmetric arrangement of power connectors. Fan trays including such features are described in greater detail with respect to FIGS. 2-4.

Each fan tray 112 may include one or more unidirectional fans. Unidirectional fans are blade and motor assemblies designed to operate in one direction. For example, unidirectional fans may operate efficiently at a relatively high speed in one direction, but operate inefficiently, at a lower speed or not at all under a reverse power source polarity. Moreover, the physically reversible fan trays 112 may be used to avoid expensive reversible fan control systems and electronically reversible fans.

Another potential advantage of reversible fan trays 112 is that efficient cooling may be achieved while maintaining a common orientation for all electronic devices 116. In the example of FIG. 1, electronic devices 110 are oriented in a common direction (i.e., facing outwardly from the page) to facilitate easy access to front panels 109 of electronic devices 110. For example, electronic devices 110 may be rack-based systems including controls at the front panels of electronic devices 110. Electronic components 116 are connected individually to front panels 109. Front panels 109 provide an interface between an operator and electronic devices 110. For example, front panels may include controls, displays, status indicators and other features. Electronic components 116 fit into slots in electronic devices 110 such that electronic components 116 may be individually removed from electronic devices 110 by pulling them outwardly. Electronic components 116 may be secured within electronic devices 110 by additional means, such as screws, tabs, clips or otherwise to prevent accidental movement of electronic components 116 in electronic devices 110. Fan trays 112 also slide into slots at the front sides of electronic devices 110 and can be individually removed in a similar manner.

In different examples, arrangement 100 may include different types of electronic devices 110 or each of electronic devices 110 may be substantially similar. Electronic devices 110 may be routers, servers, add-drop multiplexers, cross-connects, other telecommunication equipment or other electronic devices.

Figure 2A:
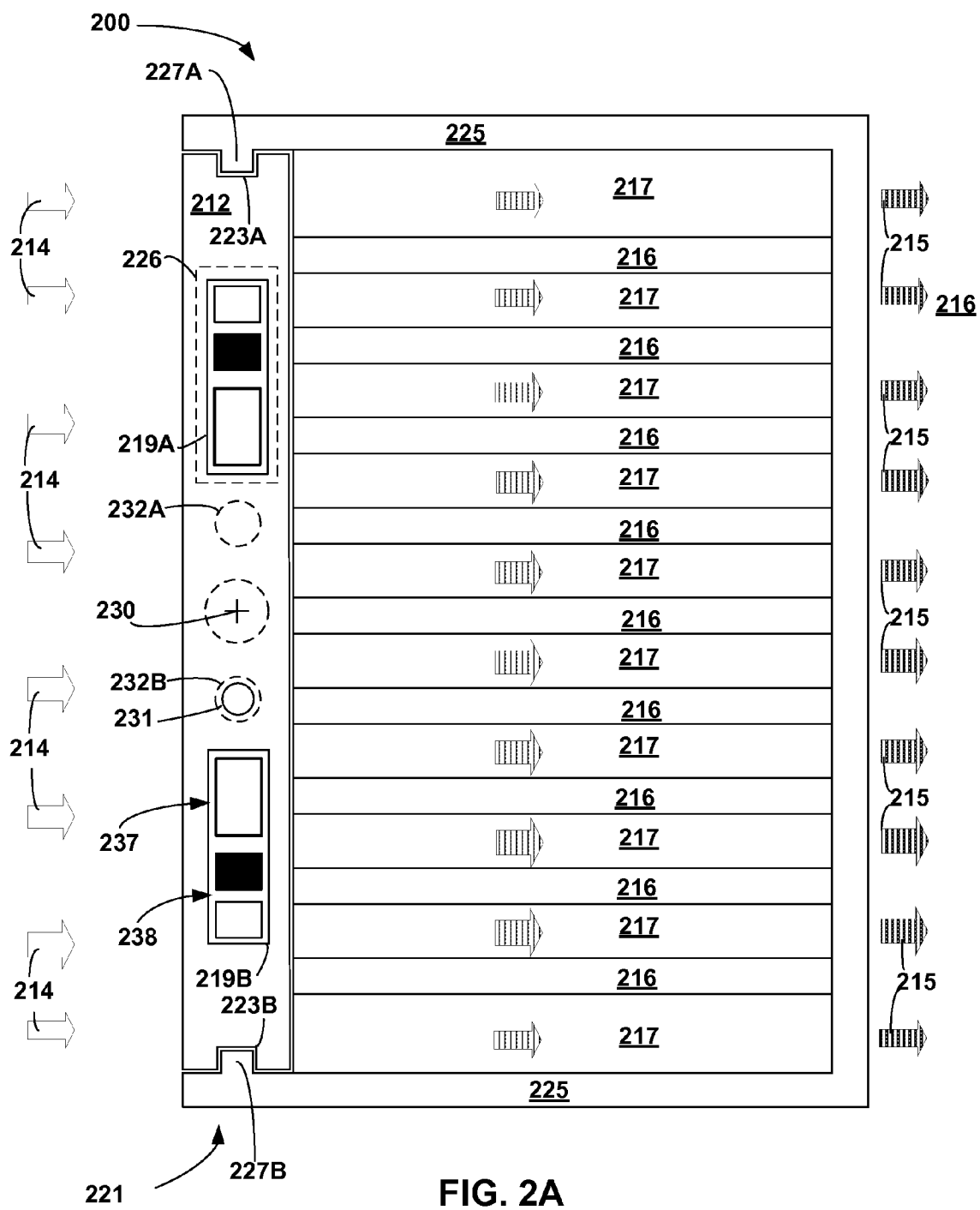
FIGS. 2A-B are illustrations of a portion of an electronic device including a reversible fan tray and a set of horizontally oriented electronic components that are cooled by an airflow created by the fan tray.
Figure 2B:
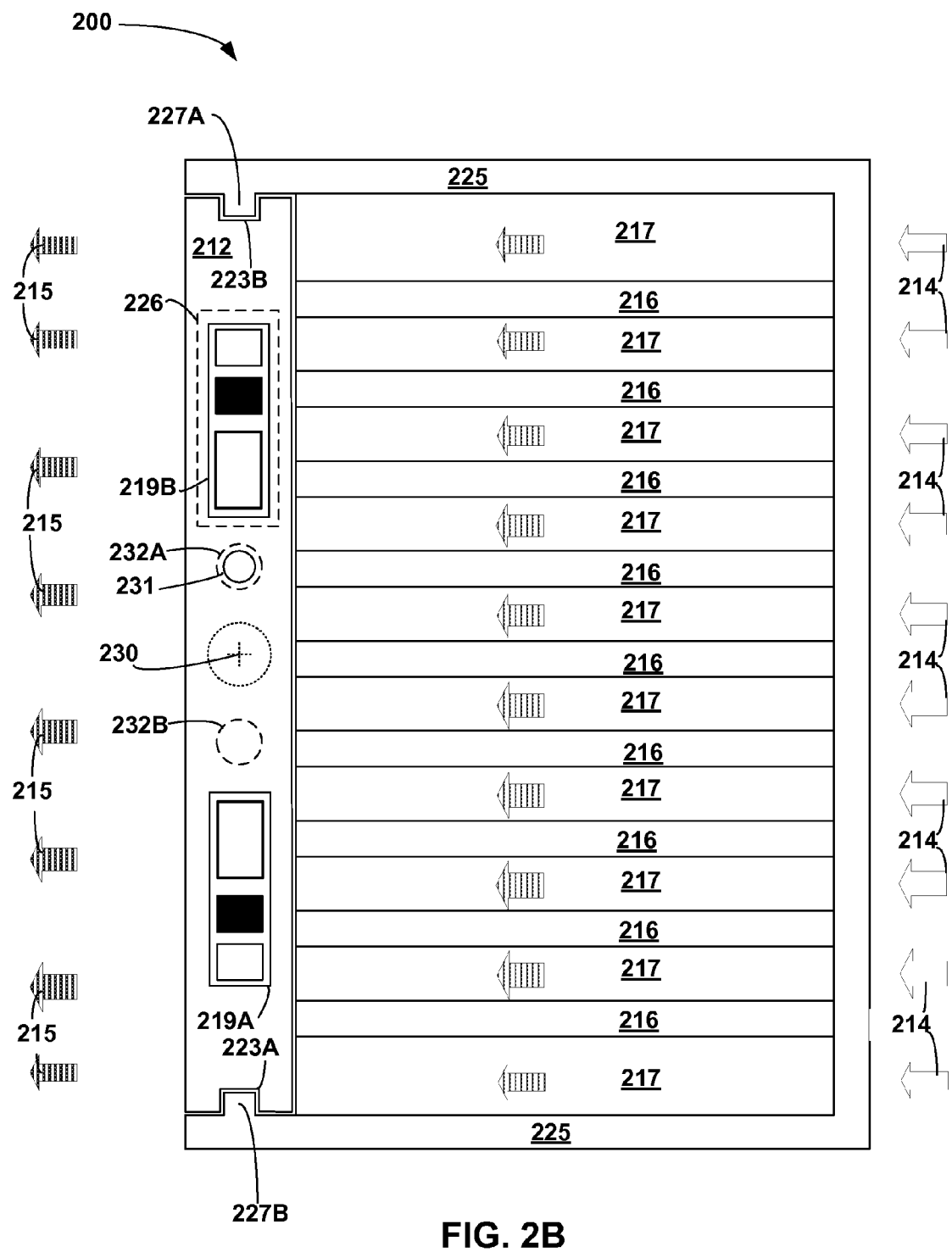

FIGS. 2A-2B are side views that illustrate a portion of an exemplary electronic device 200 including reversible fan tray 212 and electronic components 216 that are cooled by an airflow created by fan tray 212. FIG. 2A illustrates electronic device 200 in which reversible fan tray 212 is mounted with a first orientation so as to push cool air 214 through the electronic device. FIG. 2B illustrates electronic device 200 in which reversible fan tray 212 is mounted with a second orientation so as to pull cool air 215 through the electronic device.

In other words, reversing the orientation of fan tray 212 reverses the direction of the airflow through electronic device 200. In FIG. 2A, fan tray 212 is oriented to provide an airflow inlet at fan tray 212, while in FIG. 2B, fan tray 212 is oriented to provide an airflow outlet at fan tray 212. That is, in the configuration shown in FIG. 2A, fan tray 212 provides an airflow inlet that directs cool air 214 over components 216. Hot air 215 exits electronic device 200 via airflow outlets on the opposite side of electronic components 216. In contrast, in the configuration shown in FIG. 2B, fan tray 212 pulls air from electronic device 200 in order draw cool air 214 in and to cool components 216. In the configuration shown in FIG. 2B, fan tray 212 provides an airflow outlet for electronic device 200 at fan tray 212. All of the other components in electronic device 200 are the same in each of FIGS. 2A-2B.

Electronic device 200 may be a network router, server, add-drop multiplexer, cross-connect, other telecommunication equipment, or other electronic equipment. Electronic components 216 are horizontally oriented (i.e., horizontally mounted within a housing 225) to form gaps 217 through which the airflow provided by fan tray 212 passes. For example, electronic components 216 may be cards, such as printed circuit boards. Fan tray 212 contributes to an airflow through electronic device 200.

Electronic device 200 includes housing 225, which forms tabs 227A-B. Tabs 227A-B mate with grooves 223A-B, which are exemplary mounting features of fan tray 212. Other exemplary mounting features include bolts, screws, clips, tabs, locking mechanisms, clamps, etc. In the example of FIGS. 2A-B, grooves 223A-B are one feature of fan tray 212 that facilitates the two orientations of fan tray 212 shown in FIGS. 2A-B. Grooves 223A-B are symmetric about line 230. Fan tray 212 can be mounted in fan tray slot 221 such that groove 223A mates with tab 227A and groove 223B mates with tab 227B as shown in FIG. 2A or such that groove 223B mates with tab 227A and groove 223A mates with tab 227B as shown in FIG. 2B.

Connectors 219A-B also facilitate the two orientations of fan tray 212 shown in FIGS. 2A-B. As marked on connector 219B in FIG. 2A, connectors 219A-B include both a set of electrical power pins 238 and status signals connection 237. Status signals 237 provide a communication path between fan tray 212 and electronic device 200. For example, status signals 237 may be used to transmit an operational status of fan tray 212 to electronic device 200 and other information. Connectors 219A-B are symmetric about line 230. In this example, only one of connectors 219A-B is used at a time to operate fans in fan tray 212. In FIG. 2A, power connector 219A mates with connector 226, which is fixed relative to housing 225 to operate fans in fan tray 212. In FIG. 2B, power connector 219B mates with connector 226 to operate fans in fan tray 212. Due to the rotation of fan tray 212 about 230 for the different orientations, the polarity of power supplied to the fans in fan tray 212 is the same whether power connector 219A or power connector 219B is used, so that the fans in fan tray 212 always operate in the same direction relative to fan tray 212. In this manner, common unidirectional fans may be used and the airflow produced by fan tray 212 can be reversed by only reversing the orientation of fan tray 212 relative to housing 225.

Fan tray 212 also includes pin 231. Pin 231 mates with one of sensors 232A-B to indicate the orientation of fan tray 212 to electronic device 200. For example, sensors 232A-B may be push-button sensors. Sensors 232A-B are symmetric about line 230 and fixed relative to housing 225. As shown in FIG. 2A, pin 231 is mated with sensor 232B to indicate to electronic device 200 that fan tray 212 is mounted to push cool air 214 through the electronic device 200. In contrast, as shown in FIG. 2B, pin 231 is mated with sensor 232A to indicate to electronic device 200 that fan tray 212 is oriented to pull air from electronic device 200. Electronic device 200 may use this information in order to utilize temperature sensors within electronic device 200. For example, temperature sensors within components 216.

Figure 3:
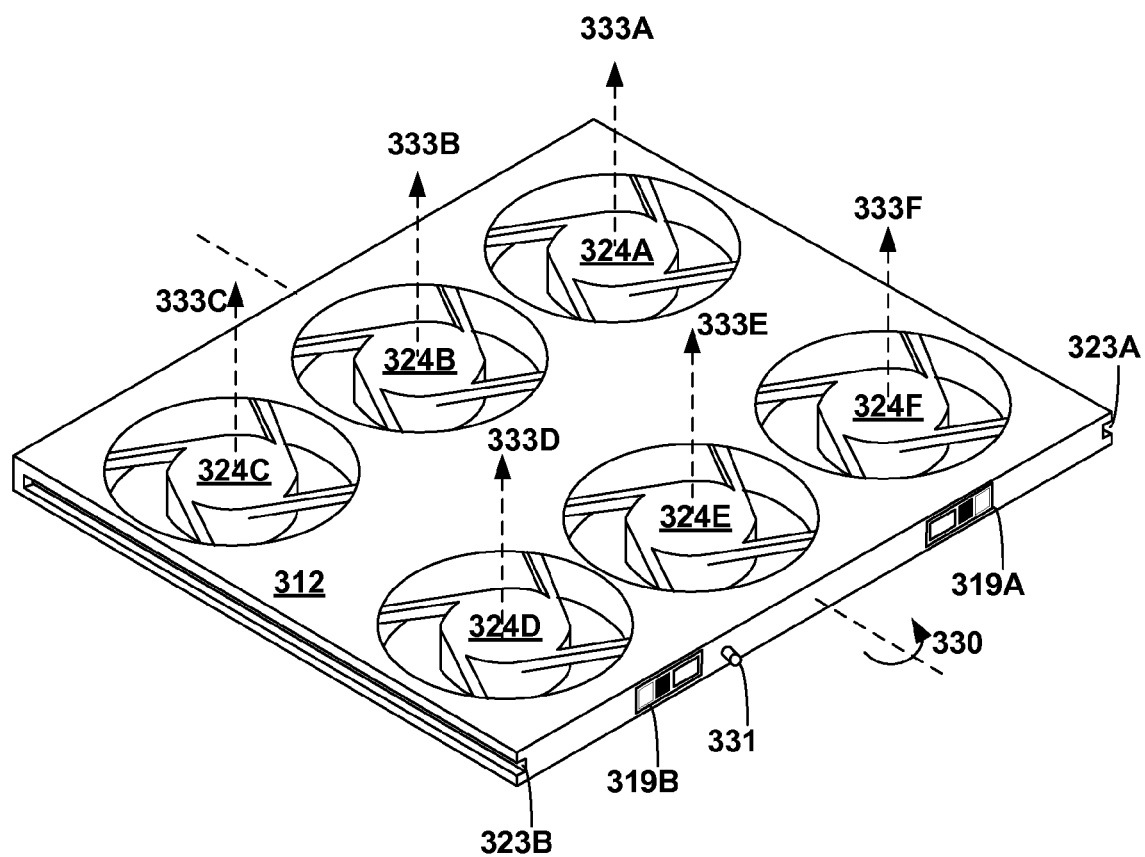
FIG. 3 is an illustration of a reversible fan tray.

FIG. 3 is an illustration of reversible fan tray 312. Reversible fan tray 312 may be substantially similar to reversible fan trays 112 (FIG. 1) and/or reversible fan tray 212 (FIGS. 2A-B). Reversible fan tray 312 includes unidirectional fans 324A-F (fans 324). Unidirectional fans 324 function to contribute to airflow along axis 333A-F (axis 333).

Fan tray 312 includes features to facilitate two orientations of fan tray 312 within an electronic device. For example, the mounting features of fan tray 312, grooves 323A-B, are symmetric about line 330. Furthermore, connectors 319A-B are also symmetric about line 330 to facilitate two orientations of fan tray 312 within an electronic device. Only one of connectors 319A-B is used at a time to operate fans 324. The polarity of power supplied to fans 324 is the same whether power connector 319A or power connector 319B is used, so that fans 324 always operate in the same direction relative to fan tray 312. In this manner, a direction of airflow produced by fan tray 312 can be changed only by changing the orientation of fan tray 312. Fan tray 312 also includes pin 331, which may indicate the orientation of fan tray 312 within an electronic device to the electronic device.

Because fan tray 312 includes multiple fans 324, fan tray 312 would continue to facilitate cooling of an electronic device even if one or more of fans 324 were to fail. For example, an electronic device may be designed such that fan tray 312 would provide sufficient cooling as long as at least a subset (e.g., five) of fans 324 remain operational. Fans 324 may be part of replaceable modules in fan tray 312 such that each of fans 324 may be individually replaced.

Figure 4:
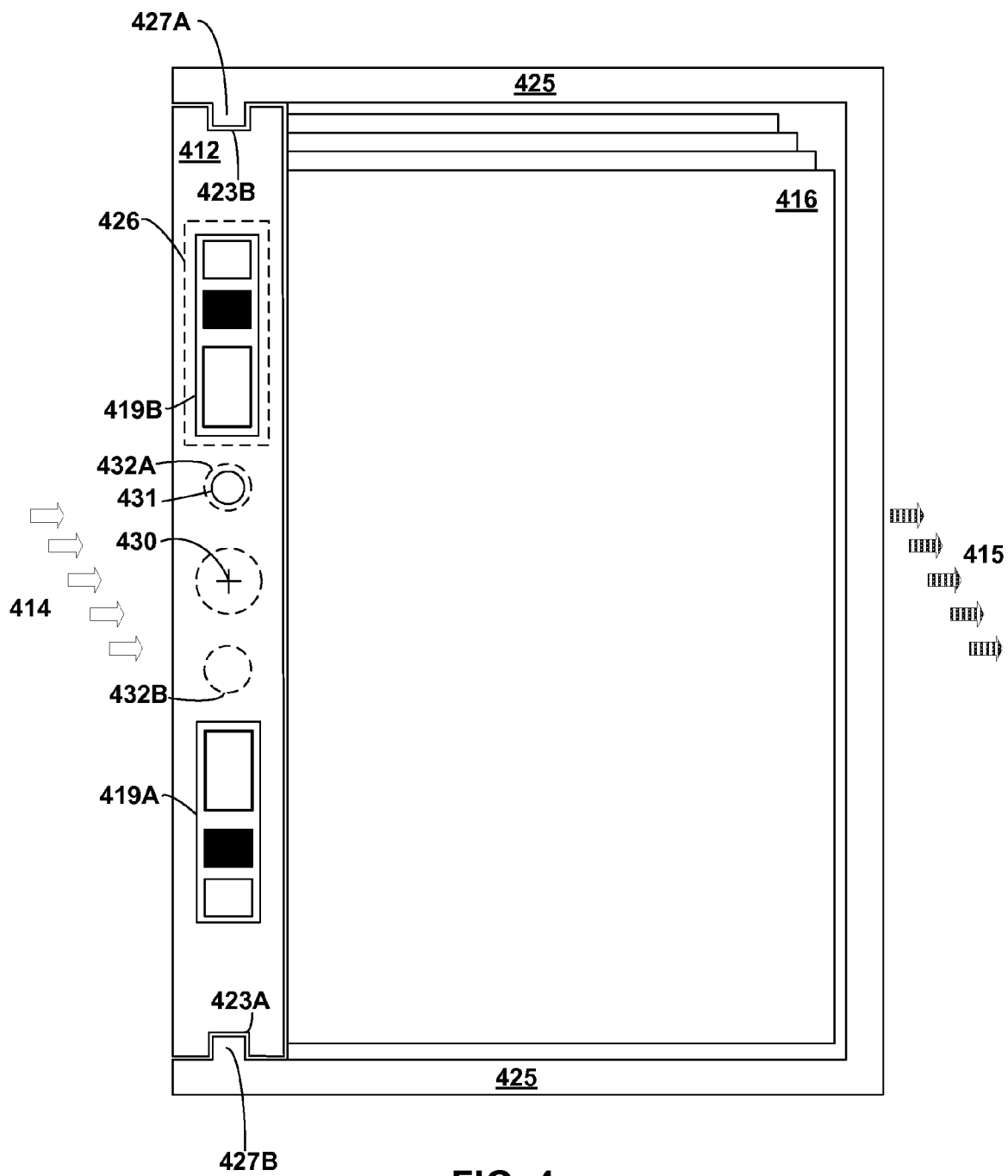
FIG. 4 is an illustration of a portion of an electronic device including a reversible fan tray and a set of vertically oriented electronic components that are cooled by an airflow created by the fan tray.

FIG. 4 is a side view illustrating a portion of another example electronic device 400 including reversible fan tray 412 and electronic components 416 that are cooled by an airflow created by fan tray 412. In this example, electronic components 416 are vertically oriented in electronic device 400 to form gaps through which the airflow provided by fan tray 412 passes. For example, electronic components 416 may be cards or blades, such as printed circuit boards. Electronic device 400 may be a network router, server, add-drop multiplexer, cross-connect, other telecommunication equipment, or other electronic equipment. Fan tray 412 contributes to an airflow through electronic device 400. Reversing the orientation of fan tray 412 reverses the direction of the airflow through electronic device 400. In FIG. 4, fan tray 412 is oriented to provide an airflow inlet; fan tray 412 may also be oriented to provide an airflow outlet such that its position is rotated 180 degrees about line 430.

In the configuration shown in FIG. 4, fan tray 412 provides an airflow inlet that directs cool air 414 over components 416. Hot air 415 exits electronic device 400 via airflow outlets on the opposite side of electronic components 416.

Electronic device 400 includes a housing 425, which forms tabs 427A-B. Tabs 427A-B mate with grooves 423A-B, which are mounting features on fan tray 412. Grooves 423A-B are symmetric about line 430 and facilitate two orientations of fan tray 412. For example, fan tray 412 can be mounted in fan tray slot 421 such that groove 423A mates with tab 427A and groove 423B mates with tab 427B as shown in FIG. 4 or such that groove 423B mates with tab 427A and groove 423A mates with tab 427B.

In this example, connectors 419A-B also facilitate two orientations of fan tray 412. Connectors 419A-B are symmetric about line 430. In this example, only one of connectors 419A-B is used at a time to operate fans in fan tray 412. In FIG. 4, power connector 419A mates with connector 426, which is fixed relative to housing 425 to operate fans in fan tray 412. In a reversed orientation, power connector 419B would mate with connector 426 to operate fans in fan tray 412. The polarity of power supplied to the fans in fan tray 412 is the same whether power connector 419A or power connector 419B is used, so that the fans in fan tray 412 always operate in the same direction relative to fan tray 412.

Fan tray 412 also includes pin 431. Pin 431 mates with one of sensors 432A-B to indicate the orientation of fan tray 412 to electronic device 400. For example, sensors 432A-B may be push-button sensors. Sensors 432A-B are symmetric about line 430 and fixed relative to housing 425. As shown in FIG. 4, pin 431 is mated with sensor 432A to indicate to electronic device 400 that fan tray 412 is mounted to push cool air 414 through the electronic device 400. In contrast, if pin 431 were mated with sensor 432B that would indicate to electronic device 400 that fan tray 412 is oriented to pull air from electronic device 400. Electronic device 400 may use this information in order to utilize temperature sensors within electronic device 400. For example, temperature sensors within components 416.

Figure 5:
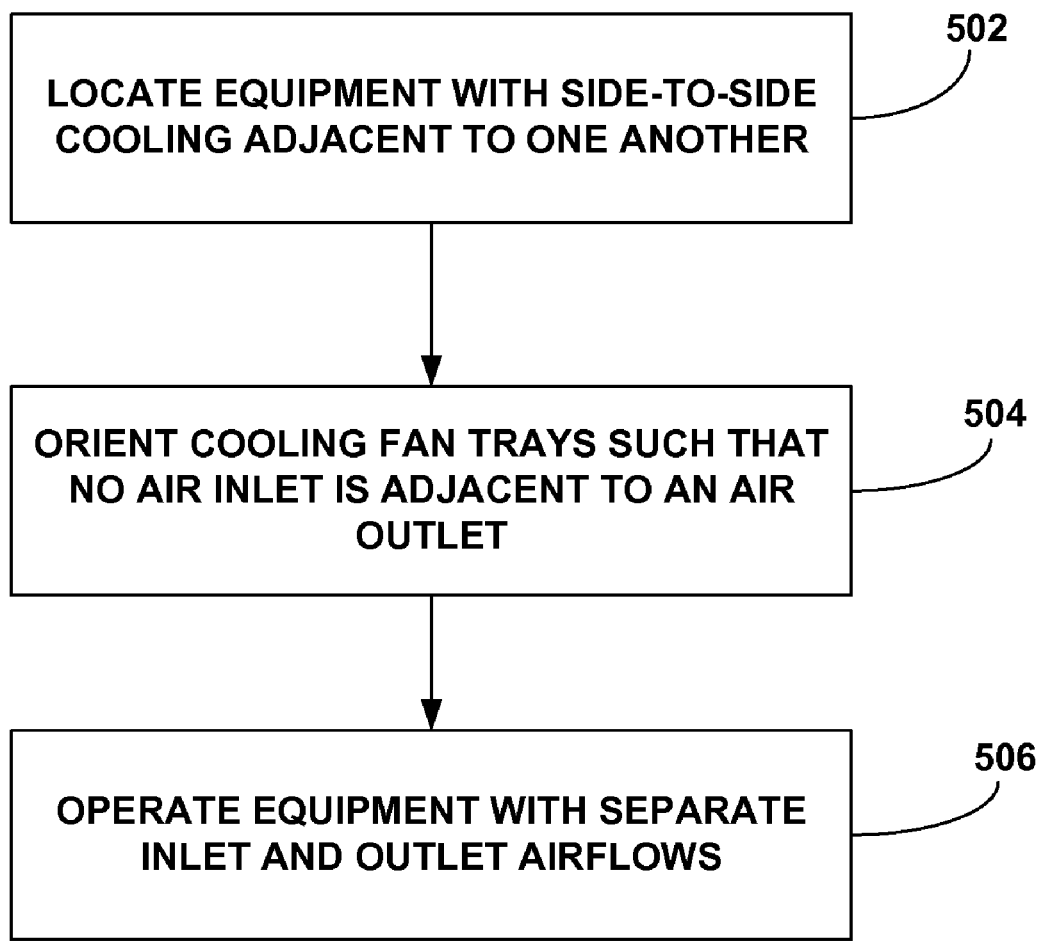
FIG. 5 is block diagram of a method for orienting reversible fan trays in arrangement of electronic devices to provide separate inlet and outlet airflows.

FIG. 5 is block diagram of a method for orienting reversible fan trays in arrangement of electronic devices to provide separate inlet and outlet airflows. For clarity, the method shown in FIG. 5 is described with reference to arrangement 100 as shown in FIG. 1.

First, electronic devices 110 are located adjacent one another in an arrangement 100 (502). In arrangement 100, electronic devices 110 are oriented in a common direction to facilitate easy access to the controls of electronic devices 110. Electronic devices 110 may be placed close together to minimize the space required for arrangement 100.

In the next step, the orientation of each reversible fan tray 112 is selected such that no airflow inlet is adjacent to any airflow outlet (504). This configuration prevents heated air exiting one electronic device 110 from being used to cool an adjacent electronic device 110. Assuming fan trays 112A are configured as shown in electronic device 110A, because fan trays 112B in electronic device 110B are adjacent to the airflow outlets of electronic device 110A, fan trays 112B are oriented to provide airflow outlets for electronic device 110B. Similarly, because fan trays 112C in electronic device 110C are adjacent to the airflow inlets of electronic device 110B, fan trays 112C are oriented to provide airflow inlets for electronic device 110C. Likewise, because fan trays 112D in electronic device 110D are adjacent to the airflow outlets of electronic device 110C, fan trays 112D are oriented to provide airflow outlets for electronic device 110D.

After fan trays 112 are oriented to separate inlet and outlet airflows among electronic devices 110, electronic devices 110 are operated (506). For example, electronic devices 110 may be routers, servers, add-drop multiplexers, cross-connects, other telecommunication equipment. Electronic devices 110 may be operated in a generally continuous manner. For this reason it may be useful for components of electronic devices 110 to be replaceable while electronic devices 110 are operating. As one example, fan trays 112 may be replaced in the event of a failure. Furthermore, individual fans within fan trays 112 may be individually replaceable to allow uninterrupted operation of electronic devices 110.

Various embodiments of the invention have been described. However, the described embodiments are merely exemplary. Changes to the described embodiments may be made within the scope of the invention. For example, the described embodiments are directed to controlling airflow to cool components of an electronic device, but other embodiments may direct airflow for other reasons. For example, airflow may be directed to warm rather than cool components of an electronic device. Furthermore, multiple fans may contribute to an airflow in series rather than in parallel.

These and other embodiments are within the scope of the following claims.

The invention claimed is:

1. An arrangement of electronic devices comprising at least two electronic devices, wherein each electronic device in the arrangement includes:
 a fan tray slot; and
 a reversible fan tray mounted in the fan tray slot providing either an airflow inlet or an airflow outlet, wherein an orientation of the reversible fan tray in the fan tray slot is reversible, wherein reversing the orientation of the reversible fan tray in the fan tray slot reverses a direction of the airflow to provide either the airflow inlet or the airflow outlet at the fan tray slot, and wherein the reversible fan tray includes,
  a frame sized to fit within the frame tray slot,
  at least two fans,
  a symmetric arrangement of mounting features fixed relative to the frame, wherein the symmetric arrangement of mounting features allows the fan tray to be mounted in the electronic device in more than one orientation at the same location within the electronic device such that the at least two fans can be oriented to either direct air into the electronic device or to pull air from the electronic device, and
  a symmetric arrangement of connectors fixed relative to the frame that coincide with the symmetric arrangement of mounting features, wherein the connectors provide an electrical connection path between the electronic device and the at least two fans in each of the more than one orientation,
 wherein the orientation of the reversible fan tray in each electronic device is selected such that if the reversible fan tray is adjacent to an airflow inlet in an adjacent electronic device, the reversible fan tray provides the airflow inlet and if the reversible fan tray is adjacent to an airflow outlet in the adjacent electronic device, the reversible fan tray provides the airflow outlet.

2. The arrangement of electronic devices of claim 1, wherein each electronic device includes two reversible fan trays oriented in a common direction.

3. The arrangement of electronic devices of claim 1, wherein each electronic device is substantially similar.

4. The arrangement of electronic devices of claim 1, wherein each electronic device is oriented in a common direction.

5. The arrangement of electronic devices of claim 1, wherein the at least two fans are unidirectional.

6. An electronic device comprising:
 a fan tray slot; and
 a reversible fan tray mounted in the fan tray slot providing either an airflow inlet or an airflow outlet, wherein the reversible fan tray includes,
  a frame sized to fit within the frame tray slot,
  at least two fans,
  a symmetric arrangement of mounting features fixed relative to the frame, wherein the symmetric arrangement of mounting features allows the fan tray to be mounted in the electronic device in more than one orientation at the same location within the electronic device such that the at least two fans can be oriented to either direct air into the electronic device or to pull air from the electronic device, and
  a symmetric arrangement of connectors fixed relative to the frame that coincide with the symmetric arrangement of mounting features, wherein the connectors provide an electrical connection path between the electronic device and the at least two fans in each of the more than one orientation,
 wherein reversing the orientation of the fan tray in the fan tray slot reverses a direction of the airflow through the electronic device.

7. The electronic device of claim 6, further comprising a plurality of components over which the airflow passes regardless of the direction of the airflow.

8. The electronic device of claim 7, wherein the plurality of components includes cards that are arranged to form slots though which the airflow passes.

9. The electronic device of claim 8, wherein the cards are arranged in a substantially horizontal orientation.

10. The electronic device of claim 6, wherein the fan tray is part of a side-to-side cooling system of the electronic device.

11. The electronic device of claim 6, wherein the fan tray includes a symmetric arrangement of mounting features that allow the orientation of the fan tray in the fan tray slot to be reversible.

12. The electronic device of claim 11, wherein the fan tray includes a symmetric arrangement of connectors that coincide with the symmetric arrangement of mounting features.

13. The electronic device of claim 6, wherein the airflow functions to cool the components.

14. The electronic device of claim 6, further comprising a filter at an airflow inlet of the electronic device.

15. The electronic device of claim 6, wherein the electronic device is a network router.

16. A fan tray comprising:
at least two fans;
a frame sized to fit within an electronic device;
a symmetric arrangement of mounting features fixed relative to the frame, wherein the symmetric arrangement of mounting features allows the fan tray to be mounted in the electronic device in more than one orientation at the same location within the electronic device such that the at least two fans can be oriented to either direct air into the electronic device or to pull air from the electronic device; and
a symmetric arrangement of connectors fixed relative to the frame that coincide with the symmetric arrangement of mounting features, wherein the connectors provide an electrical connection path between the electronic device and the at least two fans in each of the more than one orientation.

17. The fan tray of claim 16, wherein the at least two fans are unidirectional.

18. The fan tray of claim 16, wherein exactly one of the power connector is used for each of the more than one orientation.

19. The fan tray of claim 16, wherein the symmetric arrangement of mounting features is symmetric relative a line that is substantially perpendicular to an axis of rotation of one of the at least two fans.

20. The fan tray of claim 16, wherein the at least two fans are individually replaceable in the fan tray.

* * * * *

UNITED STATES PATENT AND TRADEMARK OFFICE
CERTIFICATE OF CORRECTION

PATENT NO. : 7,492,591 B1 Page 1 of 1
APPLICATION NO. : 11/621825
DATED : February 17, 2009
INVENTOR(S) : Gunes Aybay and Luong Nguyen It is certified that error appears in the above-identified patent and that said Letters Patent is hereby corrected as shown below:

On Column 8, line 63 (claim 8), "Though" should read --through--.

On Column 10, line 16 (claim 19), "relative a" should read --relative to a--.

Signed and Sealed this

Fifteenth Day of June, 2010

David J. Kappos
*Director of the United States Patent and Trademark Office*